(12) United States Patent
McCartney

(10) Patent No.: US 6,380,801 B1
(45) Date of Patent: Apr. 30, 2002

(54) OPERATIONAL AMPLIFIER

(75) Inventor: Damien McCartney, Limerick (IE)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 09/589,960

(22) Filed: Jun. 8, 2000

(51) Int. Cl.$^7$ .............................. H03F 1/02; H03F 3/45
(52) U.S. Cl. .......................................... 330/9; 330/255
(58) Field of Search .............................. 330/9, 51, 136, 330/255; 327/124

(56) References Cited

U.S. PATENT DOCUMENTS

| | | | | |
|---|---|---|---|---|
| 4,912,423 A | * | 3/1990 | Milkovic et al. | ............... 330/9 |
| 5,337,008 A | * | 8/1994 | Badyal | .................... 330/255 X |
| 6,057,734 A | * | 5/2000 | Xu | .......................... 330/255 X |

OTHER PUBLICATIONS

Johan H. Huijsing et al., "Low–Voltage Operational Amplifier with Rail–to–Rail Input and Output Ranges," *IEEE Journal of Solid–State Circuits*, vol. sc–20, No. 6., Dec. 1985, pp. 1144–1150.

John A. Fisher et al., "A Highly Linear CMOS Buffer Amplifier," *IEEE Journal of Solid–State Circuits*, vol. sc–22, No. 3, Jun. 1987, pp. 330–334.

M. D. Pardoen et al., "A Rail–to–Rail Input/Output CMOS Power Amplifier," *IEEE Journal of Solid–State Circuits*, vol. 25, No. 2, Apr. 1990, pp. 501–504.

\* cited by examiner

*Primary Examiner*—Steven J. Mottola
(74) *Attorney, Agent, or Firm*—Samuels, Gauthier & Stevens, LLP

(57) ABSTRACT

An operational amplifier having two differential input stages. A first one of the stages comprises a pair of first input transistors and another one of such stages comprises a pair of second input transistors. The second input transistors are complementary in type to the first input transistors. A comparator is fed by a sense signal and a reference signal, such sense signal being related to at least one of a non-inverting and an inverting input signal fed to the operational amplifier. The comparator produces a control signal in accordance with a difference between the sense signal and the reference signal. A switching network is responsive to the control signal and couples an output of either the first one of the stages or the second one of the stages to an output of the operational amplifier selectively in accordance with the control signal. An input chop circuit is adapted for coupling to a differential input signal, formed by the non-inverting and inverting input signals, and for providing the differential input signal with a non-inverted polarity during a first time period and such differential input signal with an inverted polarity during a succeeding time period. The differential input signal with the provided inverted polarity and the provided non-inverted polarity are fed to the coupled one of the two stages during the first time period and the succeeding time period, respectively. With such an arrangement, transitional regions where one of the stages that are coupled to the amplifier output is partially operational are eliminated, thereby reducing errors that occur in these transitional regions.

21 Claims, 11 Drawing Sheets

OPERATIONAL AMPLIFIER

BACKGROUND AND SUMMARY OF THE INVENTION

This invention relates generally to operational amplifiers and more particularly to operational amplifiers, which include chop circuits to remove offset voltages and low frequency (1/f) noise.

As is known in the art, operational amplifiers have a wide range of applications. Some operational amplifiers use chop circuits to remove offset voltages and low frequency noise. Further, as is known, some applications require that the operational amplifier operate with its inputs very close to, or even beyond, both voltage supplies of the amplifier—such an amplifier is described as having a rail-to-rail input range. Some operational amplifiers use Complementary Metal Oxide Semiconductor (CMOS) transistors. More particularly, such an amplifier may have a differential input pair of MOS transistors. For example, if it is a PMOS pair, then the input voltage can be at, or below, ground potential and the amplifier will continue to function properly. This operational amplifier also has a PMOS transistor providing the tail current to the differential input pair of transistors. However, if the input voltage moves upwards towards the positive supply voltage (i.e., the positive supply rail), then there is eventually not enough drain-to-source-voltage across the PMOS transistor to provide the tail current to the input pair of transistors and thus the amplifier ceases to operate properly.

One technique to solve this problem, and thereby provide an amplifier with rail-to-rail input range, is by using two differential input pairs of MOS transistors, the transistors in one of the pairs being complementary in type to the transistors in the other pair. The technique has been applied to bipolar operational amplifiers as well as to MOS operational amplifiers. In the case of bipolar operational amplifiers, one of the pairs uses NPN transistors and the other uses PNP transistors. In the case of MOS operational amplifiers, one of the pairs uses NMOS transistors and the other uses PMOS transistors.

More particularly, referring to FIG. 1, a MOS operational amplifier 10 is shown to include two differential input stages, 12 and 14. PMOS stage 12 includes an input differential pair of PMOS transistors $PMOS_1$, $PMOS_2$. NMOS stage 14 includes a second input differential pair of NMOS transistors $NMOS_1$, $NMOS_2$. The amplifier 10 is coupled to a supply voltage via upper voltage rail 11 and lower rail 13. The potential on the upper voltage rail 11 is AHI, here 5 volts, and the potential on the lower voltage rail 13 is here ground potential. The basic idea is to provide for the lower part of the input voltage range with the PMOS stage 12 and the upper part of the input voltage range with the NMOS stage 14.

The operational amplifier 10 is fed by a non-inverting input signal, applied to a non-inverting input terminal IN+, and by an inverting input signal, applied to an inverting input terminal IN−. The difference between these two signals is the differential input signal. An input chop circuit 16 is coupled between the input terminals IN+ and IN− and the gates of the transistors $PMOS_1$, $PMOS_2$ and $NMOS_1$, $NMOS_2$, as shown. Thus in one state (i.e., CHOP=0), the input chop circuit 16 couples the IN+ input terminal to the gates of transistors $NMOS_1$ and $PMOS_1$ and the IN− input terminal to the gates of transistors $NMOS_2$ and $PMOS_2$. In the other state (i.e., CHOP=1), the input chop circuit 16 couples the IN+ input terminal to the gates of transistors $NMOS_2$ and $PMOS_2$ and the IN− input terminal to the gates of transistors $NMOS_1$ and $PMOS_1$. The currents from the two differential stages 12, 14 are combined, in this example, in a folded cascode stage 20. The output of the folded cascode section 20 is coupled to an output or second section 22 (which includes a common mode stabilization section 24) through an output chop circuit 26. The function of the chop circuits 16 and 26 is, as noted above, to remove offset voltages and low frequency noise of the input stages 12 and 14.

$PMOS_3$, $PMOS_4$ form the tail current source in stage 12 and $NMOS_3$, $NMOS_4$ form the tail current source in stage 14. A differential input stage is said to be fully operational if the applied non-inverting and inverting input signals ensure sufficient gate-source voltage for the transistors in the differential input pair and sufficient drain-source voltages for the transistors that comprise the tail current source. The tail current is substantially invariant with input signal. A differential input stage is said to be partially operational if the applied non-inverting and inverting input signals don't ensure sufficient gate-source voltage for the transistors in the differential input pair and sufficient drain-source voltages for the transistors that comprise the tail current source. The tail current varies substantially with input signal. A differential input stage is said to be non-operational if the applied non-inverting and inverting input signals are insufficient to cause any current to flow in the input stage.

While chopper stabilization works well in operational amplifiers having a single differential input pair, we have determined that problems arise in chopping the operational amplifier having two differential input pairs such as that in FIG. 1. For example, let is be assumed that the NMOS input pair $NMOS_1$, $NMOS_2$ are well matched but that there is a 5 millivolt difference between the threshold voltage ($V_T$) of the PMOS input pair $PMOS_1$, $PMOS_2$. Furthermore, the operational amplifier 10 (FIG. 1) is configured as a voltage follower with it's output OUT connected to the inverting input terminal IN−. The signal VIN is applied to the non-inverting input terminal IN+ of the operational amplifier 10 as the non-inverting input signal. Referring to FIG. 2, VIN is swept rail-to-rail, in this case, from near 0 volts to near AHI, here +5 volts. As noted above, there are two configurations for the chop circuits (i.e., CHOP=0 and CHOP=1). The error voltage between the operational amplifier 10 output voltage and VIN, as VIN is swept, is shown for the condition when the chop circuits are in state CHOP=0 and in state CHOP=1. The upper graph shows the error for CHOP=0. It is noted that the error starts in region 30 at 5 millivolts because stage 12 is fully operational and stage 14 is non-operational and, as assumed above, the transistors $PMOS_1$ and $PMOS_2$ have a 5 millivolt differential in the transistor's threshold voltage $V_T$. Near AHI, in region 32, above 4.5 volts, with stage 14 fully operational and stage 12 non-operational, the error is 0 millivolts, because of perfect matching of $NMOS_1$ and $NMOS_2$. In the intervening region 34 where both differential input stages 12 and 14 are fully operational, the error is approximately halfway between 0 millivolts and 5 millivolts. The middle chart shows the error for the CHOP=1 condition. In this case, the error is −5 millivolts in region 30 because the pair of transistors $PMOS_1$ and $PMOS_2$ (which have the 5 millivolts differential in $V_T$) is chopped and the error is still zero volts error in region 32 where the perfectly matched $NMOS_1$ and $NMOS_2$ transistors are chopped. It is approximately −2.5 millivolts in region 34.

The net error (which should theoretically be zero from averaging the two chop states, CHOP=0 and CHOP=1) is shown in the lower graph in FIG. 2. Note that the units in net error (along the Y-axis) are now in microvolts rather than in millivolts. Chopping can be seen to operate well in three regions: in region 30 where stage 12 is fully operational and stage 14 is non-operational (i.e., below 0.5 volts); in region 32 where stage 14 is fully operational and stage 12 is non-operational (i.e., above 4.5 volts); and in region 34 where both stages 12 and 14 are filly operational (i.e., between 1 volt and 4 volts, approximately). Thus, in these regions 30, 32, and 34 the CHOP=0 state error is canceled by the CHOP=1 state error very well. The problem arises in the transition regions 36 and 38 (i.e., between 0.5 volts and 1 volt and between 4.0 volts and 4.5 volts) where one or the other of the differential input stages 12, 14 is partially operational. The chop circuits do not give rise to perfect cancellation in these transition regions and there is a residual error of about −25 microvolts at VIN=0.75 and of about—8 microvolts at VIN=4.2 volts. For many applications, an error of this magnitude would be acceptable. However, in many precision data acquisition applications such as RTD or thermocouple temperature sensor applications, such an error would be unacceptable. The fact that the error varies significantly over a small input range could be particularly unacceptable.

In accordance with the present invention, an operational amplifier is provided. The operational amplifier includes two differential input stages and is fed by non-inverting and inverting input signals. A first one of the stages comprises a differential input pair of first input transistors and another one of such stages comprises a differential input pair of second input transistors. The first input transistors are complementary in type to the second input transistors. A comparator section is fed by a reference signal and by a sense signal that is related to at least one of the non-inverting and inverting input signals. The comparator section produces a control signal in accordance with a difference between the sense signal and the reference signal. A switching network is responsive to the control signal and inhibits coupling to the output of the operational amplifier any one of the differential input stages which is only partially operational.

With such an arrangement, transition regions, where one or the other of the differential input stages is partially operational, are removed.

In a preferred embodiment of the invention, a latch fed by the control signal and a strobe signal, for latching the control signal in the latch in response to the strobe signal. The latched control signal is fed to the switching network.

With such an arrangement, the sampling rate of the strobe signal should be higher than the rate of change of the non-inverting and inverting input signals that are fed to the amplifier.

In accordance with another feature of the invention, an operational amplifier, fed by non-inverting and inverting input signals, is provided having two differential input stages. A first one of the stages comprises a pair of first input transistors and another one of such pair of stages comprises a pair of second input transistors. The second input transistors are complementary in type to the first input transistors. A comparator section is fed by a sense signal that is related to at least one of the non-inverting and inverting input signals and by a reference signal. The comparator section produces a control signal in accordance with a difference between the sense signal and the reference signal. A switching network is responsive to the control signal and couples an output of either the first one of the stages or the second one of the stages to an output of the operational amplifier selectively in accordance with the control signal. An input chop circuit is adapted for coupling to a differential input signal, that is formed by the non-inverting and inverting input signals, and for providing the differential input signal with a non-inverted polarity during a first time period and with an inverted polarity during a succeeding time period. The differential input signal with the provided non-inverted polarity and the provided inverted polarity are fed to the differential input of the coupled one of the two stages during the first time period and the succeeding time period, respectively.

BRIEF DESCRIPTION OF THE DRAWINGS

These and other features of the invention will become more readily apparent from the following detailed description when read together with the accompanying drawings, in which.

DETAILED DESCRIPTION

Figure 3:
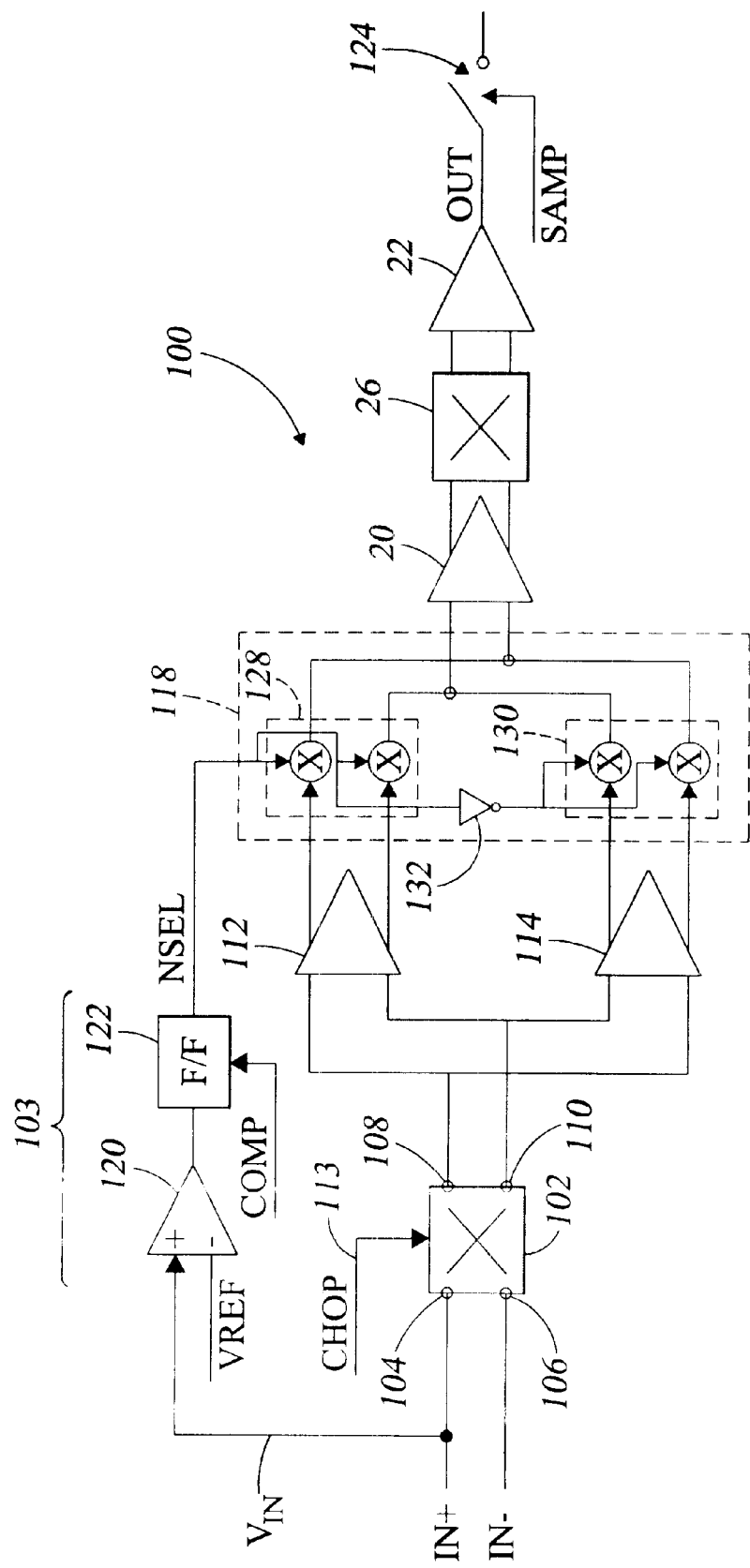
FIG. 3 is a simplified block diagram of an operational amplifier according to the invention.

Referring now to FIG. 3, an operational amplifier 100 is shown to include an input chop circuit 102 having a pair of input terminals 104, 106 and a pair of output terminals 108, 110. The input chop circuit 102 is responsive to a control signal CHOP on line 113. In response to one logic state (i.e., logic 0) of the control signal on line 113, input terminal 104 is connected to output terminal 108 and input terminal 106 is connected to output terminal 110, i.e., the input chop circuit 102 is in state CHOP=0. In response to the opposite logic state (i.e., logic 1) of the control signal on line 113, input terminal 104, is connected to output terminal 110 and input terminal 106 is connected to output terminal 108, i.e., the input chop circuit 102 is in state CHOP=1.

Figure 5:
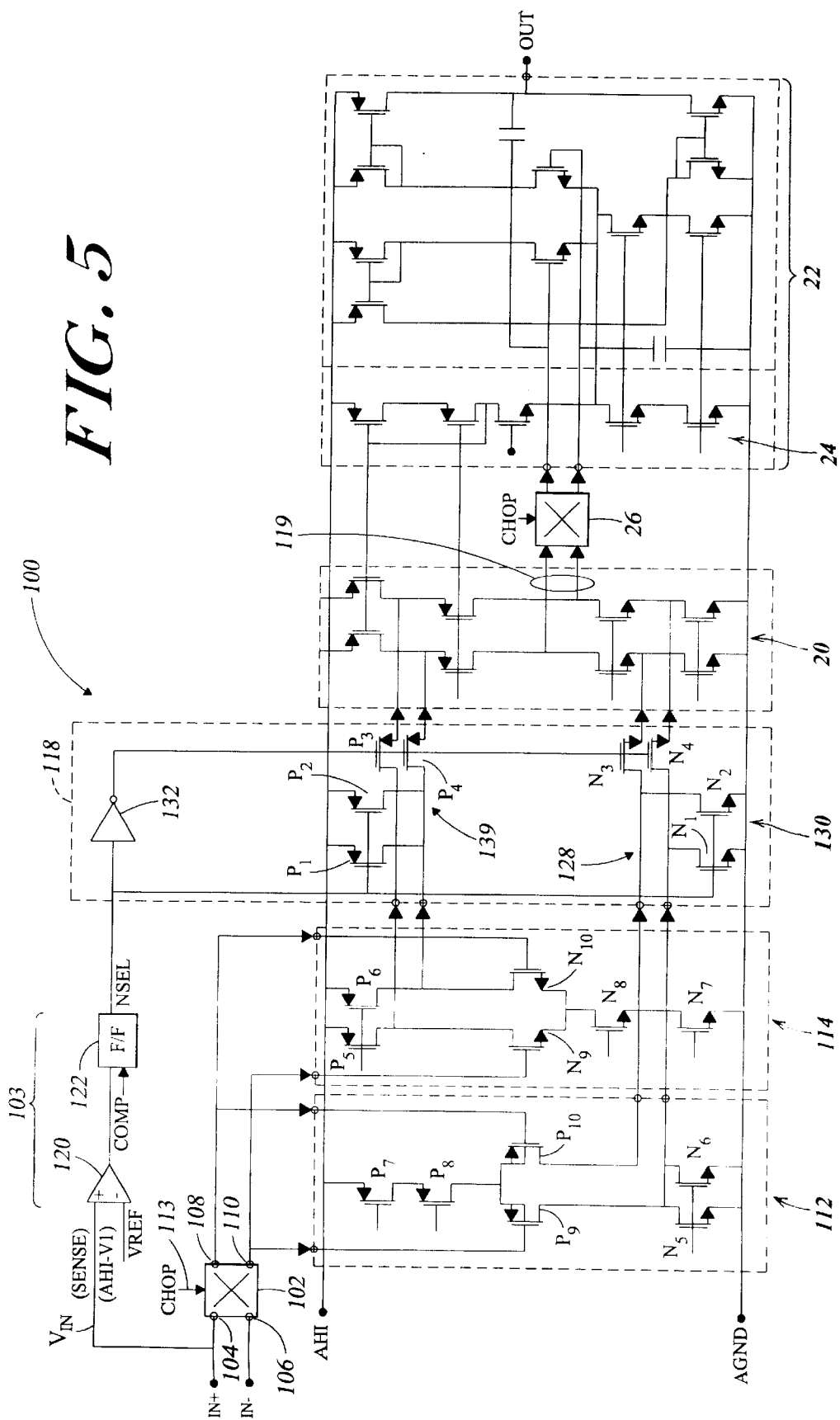
FIG. 5 is schematic diagram of the amplifier of FIG. 3.

The output terminals 108, 110 are connected to two differential input stages 112, 114. Referring also to FIG. 5, the stage 112 has a pair of transistors $P_9$, $P_{10}$, here PMOS transistors, arranged as a differential input pair and stage 114 has a pair of complementary transistors $N_9$, $N_{10}$, here NMOS, arranged as a differential input pair. (It should be understood that for a bipolar operational amplifier the transistors in one of the two differential input stages would be a differential pair of NPN transistors and the transistors in the other one of the pair of input stages would be a differential pair of PNP transistors).

The stage 112, because it contains a differential pair of PMOS transistors, has an input range down to a negative voltage rail AGND, here ground potential. The stage 114, because it contains a differential pair of NMOS transistors, has an input range up to positive voltage rail AHI. The outputs of stages 112, 114 are coupled to switching network 118. As was the case with operational amplifier 10 in FIG. 1, the operational amplifier 100 is fed with non-inverting and inverting input signals, applied to input terminals IN+ and IN− respectively. The difference between these two signals is the differential input signal. As was further the case with FIG. 1 we assume that the operational amplifier 100 is connected as a voltage follower with signal VIN applied to IN+ as the non inverting input signal and the operational amplifier output OUT connected to IN−. The terminal IN− is connected to input chop circuit 102 at terminal 106. The terminal IN+ is connected to input chop circuit 102 at terminal 104 and is also coupled (as the sense signal) to a comparator section 103 made up of a comparator 120 and a latch, here a flip-flop 122. Also fed to the comparator 120 is a reference signal, here a voltage VREF. The latch 122 is fed by the output of the comparator 120 and by a strobe signal, COMP, fed to the clock input of the latch. The comparator 120 is periodically sampled with the latch 122 by the rising edge of the strobe signal COMP. The output of the latch 122 is the control signal NSEL. If VIN is greater than VREF, then NSEL will be high (i.e., logic 1) and the output of stage 114 will be coupled through the switching network 118 to the output OUT via switch section 130, cascode section 20, output chop circuit 26, and output section 22. On the other hand, if VIN is less than, or equal to, VREF, then NSEL is low (i.e., logic 0) and the output of stage 112 is coupled to the output OUT via the switch section 128, cascode section 20, output chop circuit 26 and output section 22. The signal on OUT is here coupled to a capacitor load through a switch 124 in response to sampling signal SAMP.

For this invention to be effective, the sampling rate of the comparator 120 output should be high with respect to the rate of change of VIN. For example, if at the edge of the strobe signal it is decided that stage 112 is the appropriate stage, it is not desirable for VIN to move into a region where stage 112 is non-operational before the next strobe signal edge.

Figure 4:
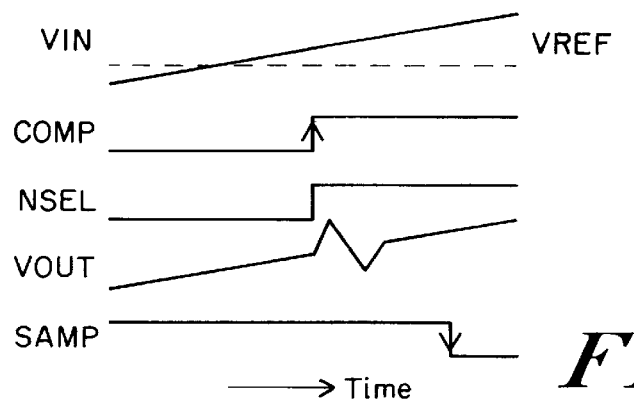
FIG. 4 is a set of timing histories useful in understanding the operation of the amplifier of FIG. 3.

There will of course be an output transient at OUT when VIN passes through VREF and the switching network 118 switches from one of the stages 112, 114 to the other one of the stages 112, 114; however, the invention is most appropriate, but not limited to, discrete time systems (as shown in FIG. 3), where the output is sampled periodically by switch 124, as distinct from continuous time systems. Thus, here the switch 124 couples the voltage on OUT to capacitor C in response to the high state of the sampling signal SAMP which goes low some time after the rising edge of the strobe signal COMP. Therefore, only the value of VOUT at the falling edge of SAMP is relevant and any output transient is ignored. The timing diagram for the operational amplifier 100 is shown in FIG. 4.

Referring again to FIG. 5, a more detailed description of operational amplifier 100 (FIG. 3) with like elements being designated by the same numerical designation. The amplifier 100 includes two differential input stages 112, 114. A first one of the stages, here stage 112, comprises the pair of first input transistors $P_9$, $P_{10}$ and the stage 114 comprises the pair of second input transistors $N_9$, $N_{10}$. Thus, the second input transistors $N_9$, $N_{10}$, which are NMOS type transistors, are complementary in type to the first input transistors $P_9$, $P_{10}$, which are PMOS transistors. A comparator 120 is provided. The comparator 120 is fed by a sense signal, here by the VIN signal on terminal IN+. The comparator 120 is also fed by a reference signal, here a voltage VREF=AHI−V1, where V1 is approximately 1.25V. The value of V1 is selected so as to provide a sufficient gate-to-source voltage for the PMOS differential input pair of stage 112 (i.e., transistors $P_9$, $P_{10}$), and sufficient drain-source voltage for the tail currect transistors $P_7$, $P_8$ of stage 112. In other words stage 112 is fully operational when VIN is equal to or less than VREF. It is also arranged that stage 114 is fully operational when VIN is greater than VREF. The comparator 120 produces a logic signal in accordance with a difference between the signal VIN and the reference signal VREF.

The logic signal is sampled in response to the strobe signal COMP that is fed to the clock input of the latch, here flip-flop, 122, as indicated. The stored logic signal provides the control signal NSEL for the switching network 118 as described in accordance with FIG. 3.

The switching network 118 is responsive to the control signal NSEL and couples an output of either the first one of the stages 112, 114 or the second one of the stages 112, 114 to the cascode section 20 selectively in accordance with the control signal NSEL.

More particularly, the switching network 118 includes a set of PMOS transistors $P_1$–$P_4$ arranged to provide switch section 130 (FIG. 5) and a set of NMOS transistors N1–N4 arranged to provide switch section 128 (FIG. 5). The control or gate electrodes, of the PMOS transistors $P_1$, $P_2$ and NMOS transistors $N_1$, $N_2$ are connected directly to the flip-flop 122, while the control electrodes of PMOS transistors $P_3$, $P_4$ and NMOS transistors $N_3$, $N_4$ are connected to the flip-flop 122 through an inverter 132. Thus, when the potential at IN+ is greater than VREF, the output of comparator 120 is a logic 1 which gets latched into flip-flop 122 in response to the leading edge of the COMP strobe signal shown in FIG. 6. On the other hand, when the potential at IN+ is less than or equal to VREF, the output of comparator 120 is a logic 0 which gets latched into flip-flop 122 in response to the leading edge of the COMP strobe signal. When a logic 1 is latched into the flip-flop 122, (i.e., NSEL=1), $P_1$, $P_2$ are off and $P_3$, $P_4$ are on to thereby couple the output of stage 114 to the cascode stage 20. Meanwhile, N1, N2 are on and $N_3$, $N_4$ are off so that the output of stage 112 is de-coupled from cascode section 20 and is clamped to the negative voltage rail AGND, here ground. On the other hand, when a logic 0 is latched into the flip-flop 122 $N_1$, $N_2$ are off and $N_3$, $N_4$ are on thereby coupling the output of stage 112 to cascode stage 20. Meanwhile, $P_1$, $P_2$ are on and $P_3$, $P_4$ are off so that the output of stage 112 is de-coupled from cascode section 20 and clamped to the positive voltage rail, AHI. Thus, as noted in connection with FIG. 3, only one of the two stages 112, 114 is fed to the cascode stage 20, and hence to the output stage 22, at any given voltage over the operating range of VIN from AGND (i.e., ground) to the voltage AHI, here 5 volts (i.e., from rail-to-rail).

Figure 1:
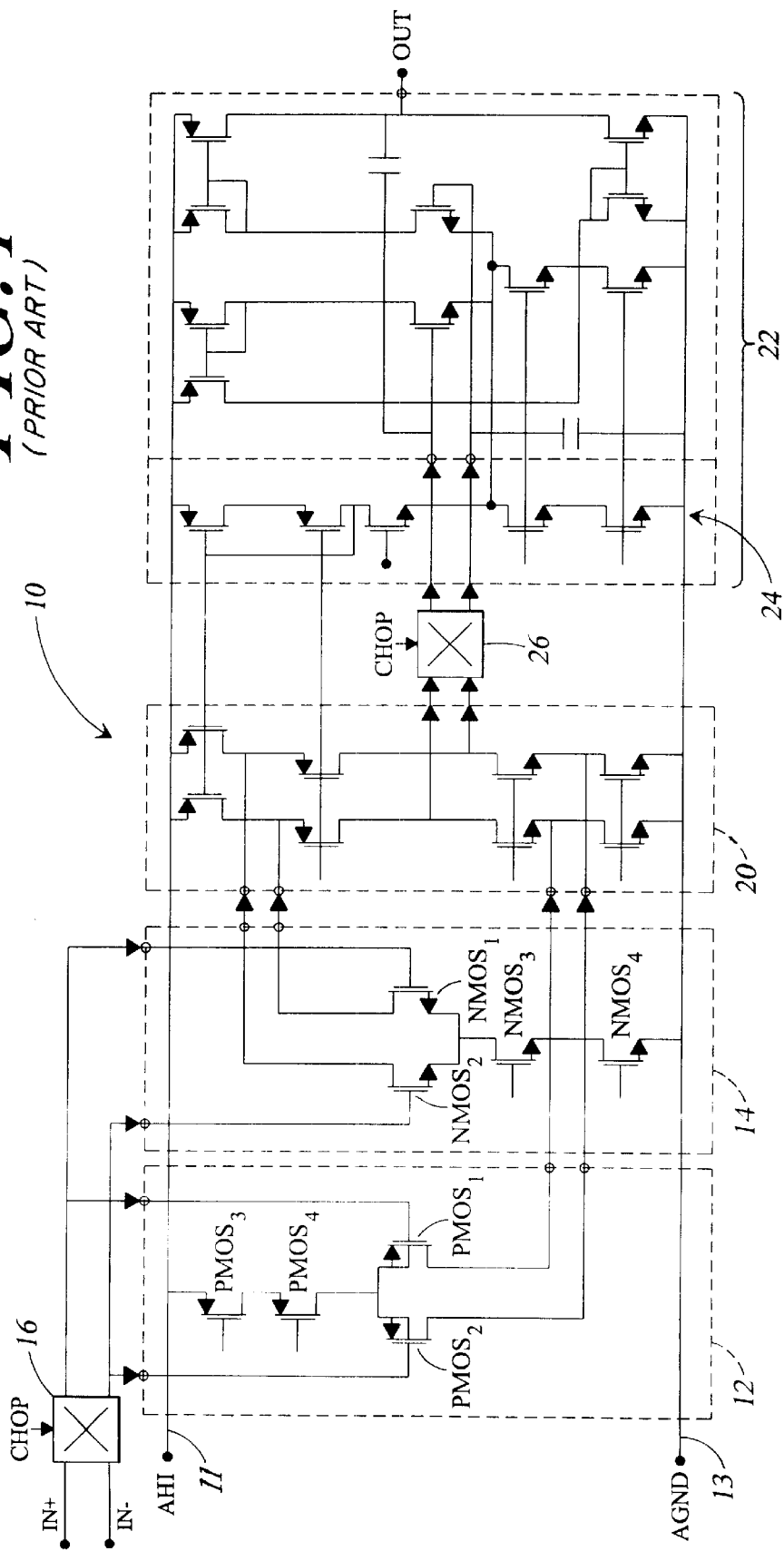
FIG. 1 is a schematic diagram of an operational amplifier according to the PRIOR ART.

It should be noted in FIG. 5 that the NMOS stage 114 has a pair of transistors $P_5$, $P_6$ which are not in the amplifier 10 of FIG. 1. The value of each of these current sources provided by transistors $P_5$, $P_6$ is set at half the tail current of the transistors $N_7$, $N_8$. This means that when the voltage at terminal IN+ increases above AHI−V1 and stage 114 is coupled to the cascode stage 20, there is nominal current balance in stage 114 and no current disturbance caused to the cascode stage 20. The coupling between stage 114 and the cascode stage 20 is via the $P_3$, $P_4$ switches and is primarily voltage coupling-with minimal DC current flow through the $P_3$, $P_4$ switches. As long as stage 114 is not selected (i.e., de-coupled), the differential outputs of stage 114 are clamped to AHI−V1 through switches $P_1$, $P_2$. This keeps the output close to the values they will take up once stage 114 is coupled to the cascode stage 20 (typically 200 millivolts to 500 millivolts below AHI). As IN+ increases towards the switching voltage VREF=AHI−V1, stage 114 is fully operational, and together with the current source load P5, P6 constitute a high gain stage in open loop. In the absence of this output clamping, the outputs would be driven apart and a greater disturbance to the cascode stage 20 would result on coupling through transistors $P_3$, $P_4$.

Likewise, stage 112 has two current sources $N_5$, $N_6$. The function of $N_1$, $N_2$, $N_3$, $N_4$, $N_5$ and $N_6$ with respect to stage 112 should now be evident from the discussion above with respect to stage 114. In the preferred embodiment, hysteresis is added to the comparator 120. Thus, if VIN is very close to the reference signal VREF=AHI−V1, the hysteresis will prevent the operational amplifier 100 from continually toggling between stage 112 and stage 114. Therefore, stage 114 is selected (i.e., coupled) as soon as VIN exceeds VREF; stage 112 will not be re-selected (i.e., re-coupled) until VIN falls below VREF−VHYS=AHI−V1−VHYS, where VHYS is the hysteresis voltage, typically 10 millivolts to 100 millivolts.

Figure 2:
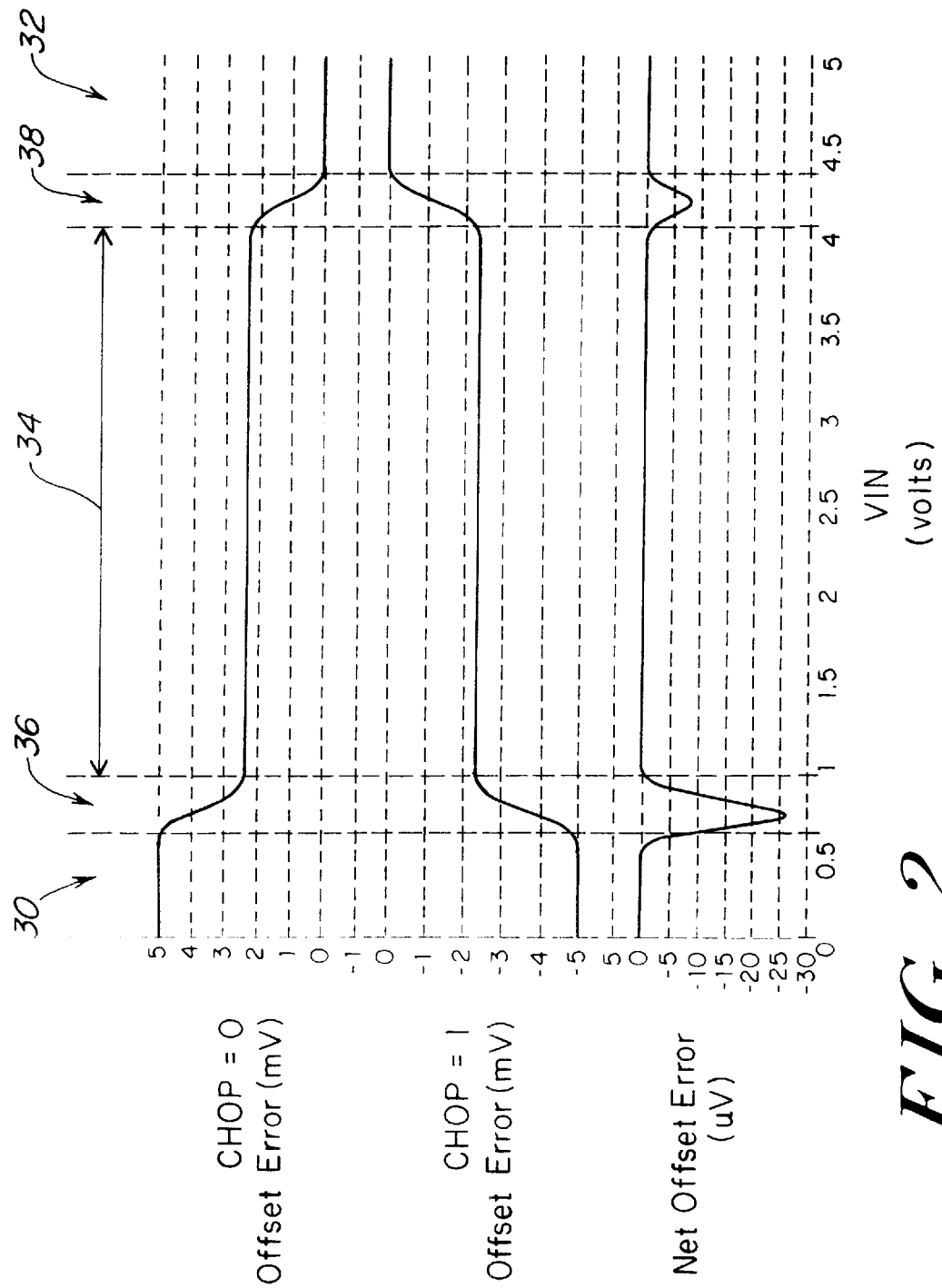
FIG. 2 is a set of graphs showing the effectiveness of the amplifier of FIG. 1 in reducing voltage errors as a function of input voltage.
Figure 7:
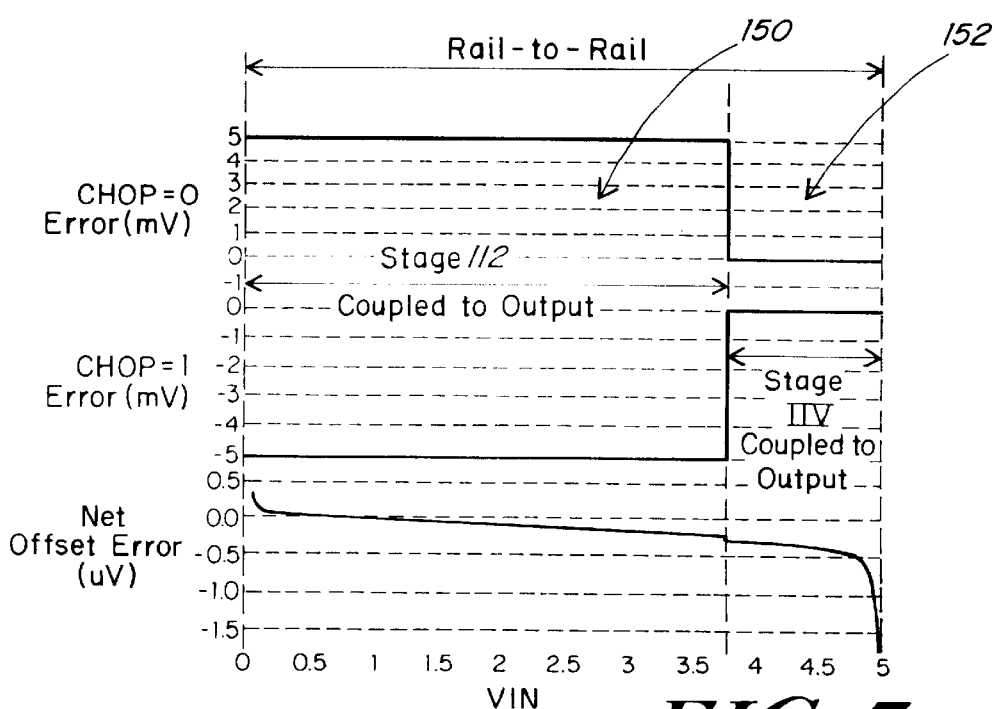
FIG. 7 is a set of graphs useful in understanding the operation of the amplifier of FIG. 5.

Referring now to FIG. 7, the error in millivolts as a function of VIN is shown for the CHOP=0 condition of chop circuits 102, 26 and for the CHOP=1 condition of chop circuits 102, 26. The lower curve of FIG. 7 shows the net error in microvolts. It is noted in FIG. 7 that VREF is here about 3.75 volts. It is noted that, unlike the amplifier 10 (FIGS. 1 and 2) which had five regions of operation 30, 32, 34, 36 and 38, the amplifier 100 has only two regions of operation, i.e., region 150, where stage 112 is coupled, or selected, and region 152, where stage 114 is coupled or selected. Region 150 is from an input voltage of zero volts to VREF, here about 3.75 volts where only stage 112 is coupled to the cascode stage 20, and region 152 is from VREF to AHI where only stage 114 is coupled to the cascode stage 20. FIG. 7 shows that the offset cancellation from chop circuits 102, 26 is excellent in both regions 150, 152 and that there is a small error of a fraction of a micro volt as one switches between the two regions 150, 152.

Figure 6:
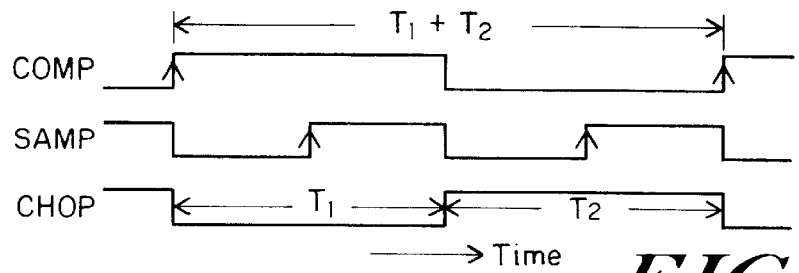
FIG. 6 is a set of timing diagrams of signals used in the amplifier of FIG. 5.

As noted briefly above, FIG. 6 shows the timing signals for the operational amplifier 100. The signal SAMP is the control signal for switch 124 described in connection with FIG. 3, such switch not being shown in FIG. 5 but would be coupled to the OUT terminal of amplifier 100 in FIG. 5. The OUT terminal is coupled to the output of switch 124 in response to a high value for SAMP and is sampled on the falling edge of SAMP. It should be noted that there is at least one sample of the output (OUT) per state of the CHOP signal. Furthermore, between successive rising edges of the COMP strobe signal, there is at least one fill cycle of the CHOP signal so that even if one of the stages 112, 114 is selected for only one cycle of the COMP signal, proper offset voltage compensation is provided by the same number of output samples being taken when CHOP=0 as when CHOP=1. As described above in connection with FIG. 3, it should be noted that the input chop circuit 102 is adapted for providing the differential input signal at terminals 104, 106 to the two differential input stages 112, 114 with a non-inverted polarity during a first time period $T_1$ (FIG. 6) and providing such differential input signal with an inverted polarity during a succeeding time period $T_2$.

It should be noted that the amplifier 100 in FIG. 5 uses the signal at the IN+ terminal as the sense signal for the comparator 120 rather than the signal at IN− or some average of both. This is because in any closed loop operation of the amplifier 100, both IN+ and IN− will be at approximately the same voltage. It is preferable to monitor the non-inverting (+) terminal IN+ because it is usually connected to a known voltage. The terminal IN−, on the other hand, is usually driven by the operational amplifier output directly or through a feedback network. If it were input to comparator 120, this could give rise to undesired oscillations through the comparator 120 or lock-up where the operational amplifier is unable to come to a correct operating condition.

Thus, the sense signal is related to at least one of the non-inverting and inverting input signals of the operational amplifier 10. While here the sense signal is the non-inverting input signal, the sense signal may also be the inverting input signal or derived from both the non-inverting and inverting input signals.

The operational amplifier 100 has two differential input stages 112, 114. A first one of the stages comprises a pair of first input transistors and another one of such stages comprises a pair of second input transistors. The second pair transistors are complementary in type to the first pair of transistors. The amplifier 100 includes a comparator section, comprising comparator 120 and latch 122, which is fed by a sense signal, here VIN, and a reference signal, VREF. The comparator section produces a control signal NSEL in accordance with a difference between the sense signal and the reference signal. The switching network 118 is responsive to the control signal NSEL and couples either the first one of the differential input stages or the second one of the differential input stages to an output of the switching network 118, and therefore to the output OUT of the operational amplifier 100, selectively in accordance with the control signal NSEL. An input chop circuit 102 is adapted for providing the differential input signal at terminals IN+, IN− to the two differential input stages 112, 114 with a non-inverted polarity during a first time period $T_1$ and providing such input signal with an inverted polarity during a succeeding time period $T_2$.

Figure 8:
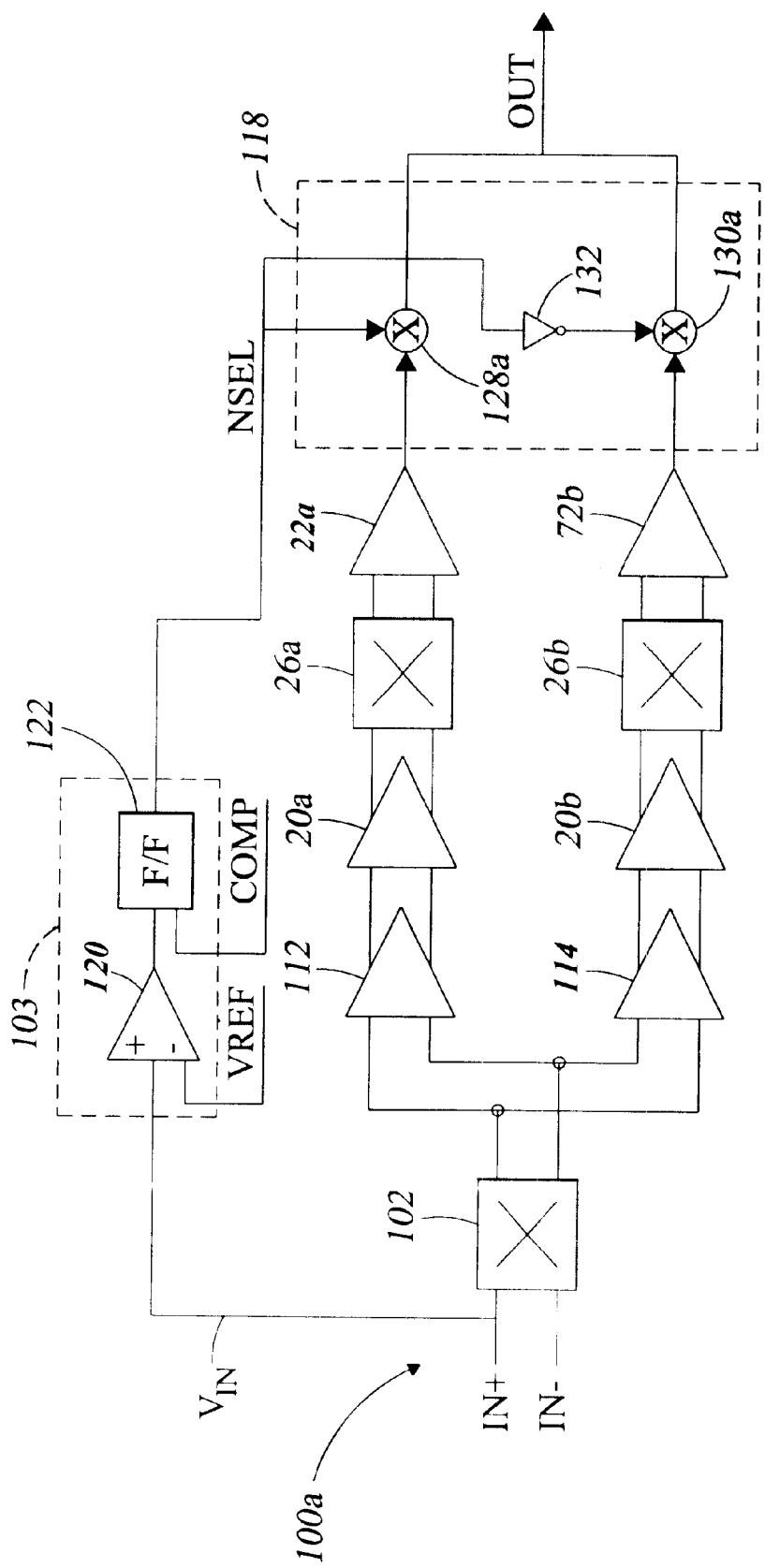
FIGS. 8–12 are schematic diagrams of operational amplifiers according to alternative embodiments of the invention.

Referring now to FIG. 8, an operational amplifier 100a is shown where the same elements are designated with the same numerical designation as used with the amplifier 100 in FIG. 5. Here, however, the stages 112, 114 are fed to a corresponding one of two cascode sections 20a, 20b, respectively. Each one of the cascode sections 20a, 20b is coupled to a corresponding one of two output chop circuits 26a, 26b, as shown. Each one of the output chop circuits 26a, 26b is coupled to a corresponding one of two output sections 22a, 22b. The outputs of output sections 22a, 22b are coupled to a corresponding one of two switches 128a, 130a of switching network 118, as indicated. The output of the switching network 118 is coupled to OUT, as indicated. Here again, the amplifier 100a has two differential input stages 112, 114. A first one of the stages comprises a first pair of transistors and another one of such stages comprises a second pair of transistors. The second pair of transistors is complementary in type to the first pair of transistors. The amplifier 100a includes the comparator section 103 which comprises comparator 120, which is fed by a sense signal, here VIN, and a reference signal VREF, and further comprises latch 122 which is fed by strobe signal COMP. The comparator section 103 produces a control signal NSEL in accordance with a difference between the sense signal and the reference signal. The switching network 118 is responsive to the control signal NSEL and couples the output of either the first one of the differential input stages 112, 114 or the output of the second one of the differential input stages 112, 114 to an output of the switching network 118, and therefore to the output OUT of the amplifier 100a, selectively in accordance with the control signal NSEL. An input chop circuit 102 is adapted for providing the differential input signal at terminals IN+, IN– to the two differential input stages 112, 114 with a non-inverted polarity during a first time period $T_1$ and providing such differential input signal with an inverted polarity during a succeeding time period $T_2$.

Figure 9:
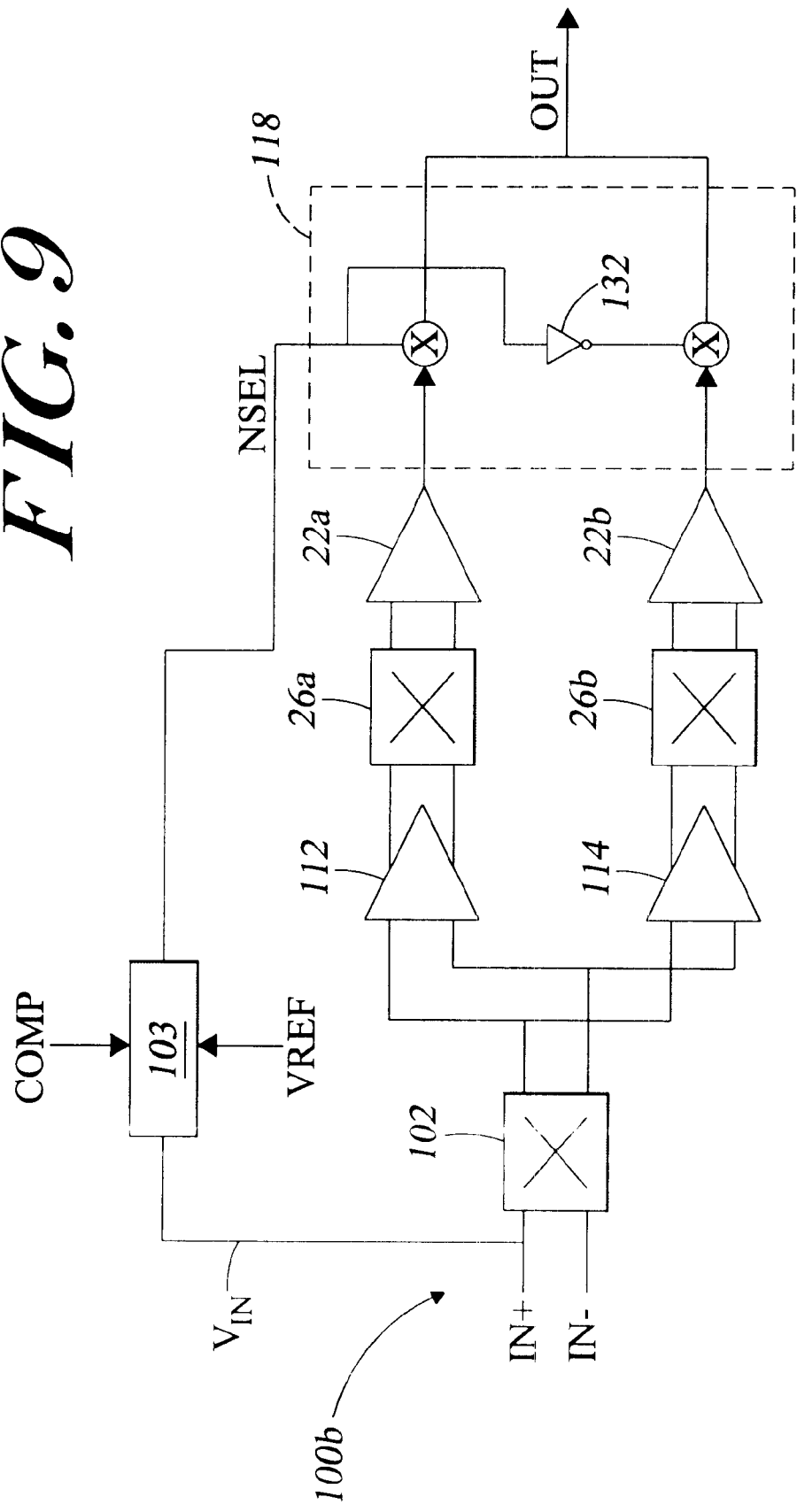

Referring now to FIG. 9, an operational amplifier 100*b* is shown where the same elements are designated with the same numerical designation as used with the amplifier 100*a* in FIG. 8. Here, however, the stage 112 and cascode section 20*a* are combined into a differential input stage 112' and the stage 114 and cascode section 20*b* are combined into a differential input stage, 114'. A first one of the stages, 112', 114' comprises a pair of first input transistors and another one of such stages 112', 114' comprises a pair of second input transistors. The second pair of transistors is complementary in type to the first pair of transistors. The amplifier 100*b* includes comparator section 103 that is fed by a sense signal, here VIN, and a reference signal VREF. The comparator section 103 produces a control signal NSEL in accordance with a difference between the sense signal and the reference signal, VREF. The switching network 118 is responsive to the control signal NSEL and couples either the output of the first one of the differential input stages 112', 114' or the output of the second one of the differential input stages 112', 114' to an output of the switching network 118, and therefore to the output OUT of the amplifier 100*b*, selectively in accordance with the control signal NSEL. An input chop circuit 102 is adapted for providing the differential input signal to the two differential input stages 112', 114' with a non-inverted polarity during a first time period $T_1$ and providing such differential input signal with an inverted polarity during a succeeding time period $T_2$.

Figure 10:
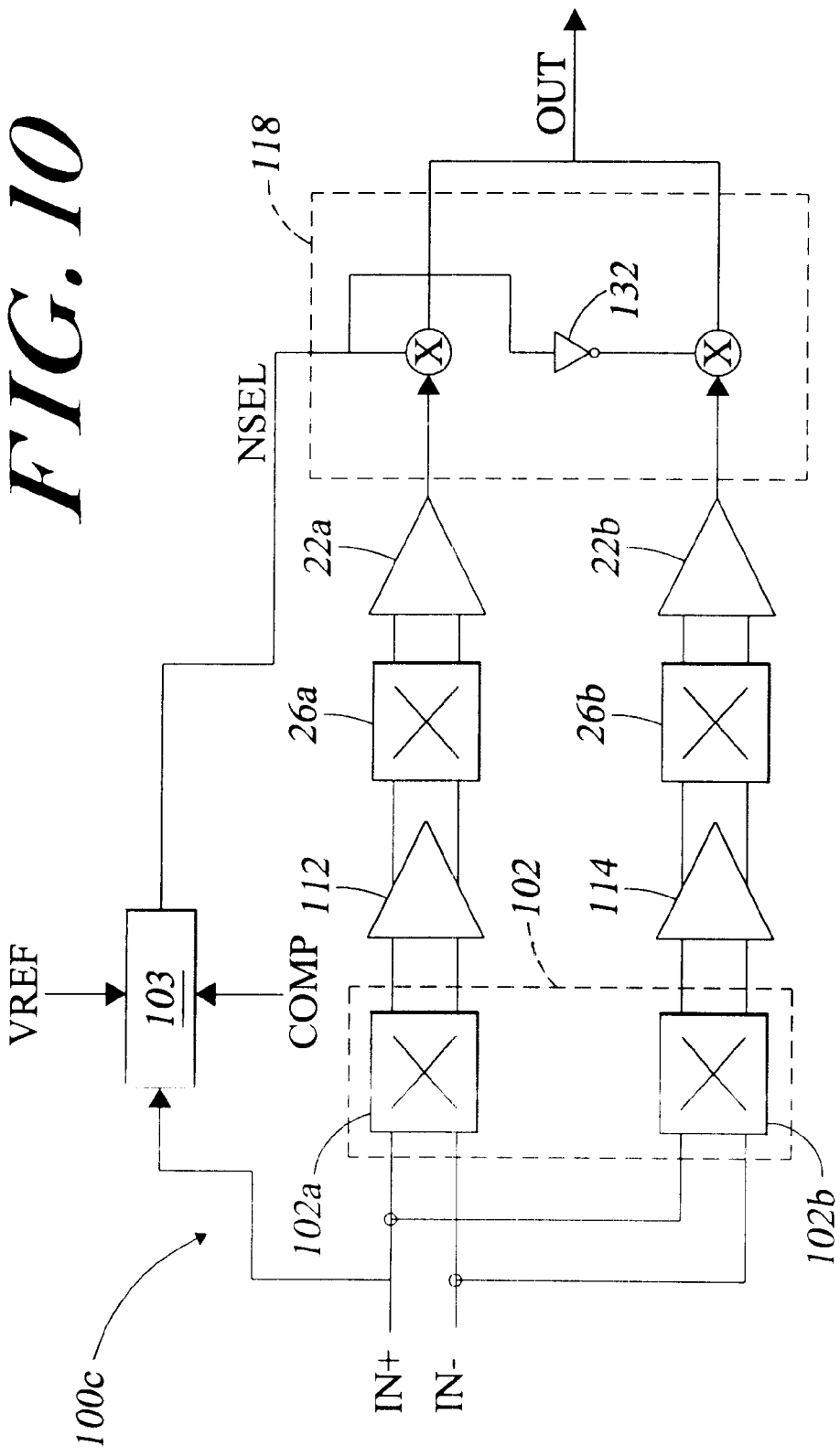

Referring now to FIG. 10, an operational amplifier 100*c* is shown where the same elements are designated with the same numerical designation as used with the amplifier 100*b* in FIG. 9. Here, however, the input chop circuit 102 in amplifier 100*b* of FIG. 9 is made up of two input chop circuits 102*a*, 102*b* to provide input chop circuit 102'. Thus, here again, the amplifier 100*c* has two differential input stages 112', 114'. A first one of the stages comprises a pair of first input transistors and another one of such stages comprises a pair of second input transistors. The second pair of transistors is complementary in type to the first input transistors. The amplifier 100*c* includes the comparator section 103 that is fed by a sense signal, here VIN, the reference signal, VREF, and the strobe signal COMP. The comparator section 103 produces a control signal NSEL in accordance with a difference between the sense signal and the reference signal, VREF. The switching network 118 is responsive to the control signal NSEL and couples either the first one of the differential input stages 112', 114' or the second one of the differential input stages 112', 114' to an output of the switching network 118, and therefore to the output OUT of amplifier 100*c*, selectively in accordance with the control signal NSEL. An input chop circuit 102' is adapted for providing the differential input signal to the two differential input stages 112', 114' with a non-inverted polarity during a first time period $T_1$ and providing such input signal with an inverted polarity during a succeeding time period $T_2$.

Figure 11:
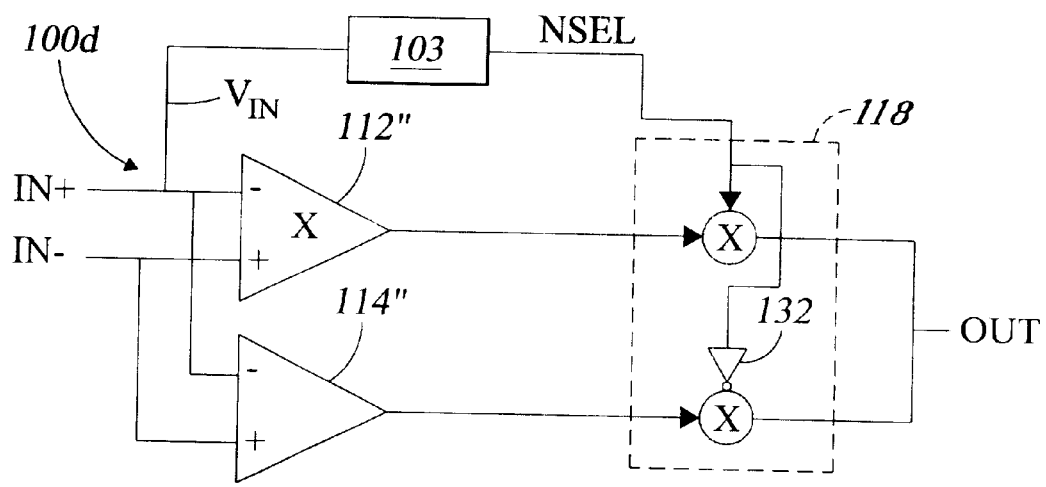

Referring now to FIG. 11, an operational amplifier 100*d* is shown where the same elements are designated with the same numerical designation as used with the amplifier 100*c* in FIG. 10. Here, however, and referring also to FIG. 10, the input chop circuit 102*a*, differential input stage 112', the output chop circuit 26*a* and output section 22*a* are represented as a first chopped operational amplifier 112" and the chop circuit 102*b*, differential input stage 114', output chop circuit 26*b* and output section 22*b* are represented as a second chopped operational amplifier 114". The amplifier 100*d* has two chopped operational amplifiers 112", 114". A first one of the operational amplifiers comprises a pair of first input transistors and the second one of the operational amplifiers comprises a pair of second input transistors. The second pair of transistors is complementary in type to the first pair of transistors. The amplifier 100*d* includes the comparator section 103 which is fed by a sense signal, here VIN, the reference signal VREF, and the strobe signal COMP. The comparator section 103 produces a control signal NSEL in accordance with a difference between the sense signal and the reference signal. The switching network 118 is responsive to the control signal NSEL and couples either the first one of the operational amplifiers 112", 114" or the second one of the operational amplifiers 112", 114" to an output of the switching network 118, and therefore to the output OUT of amplifier 100*d*, selectively in accordance with the control signal NSEL.

Figure 12:
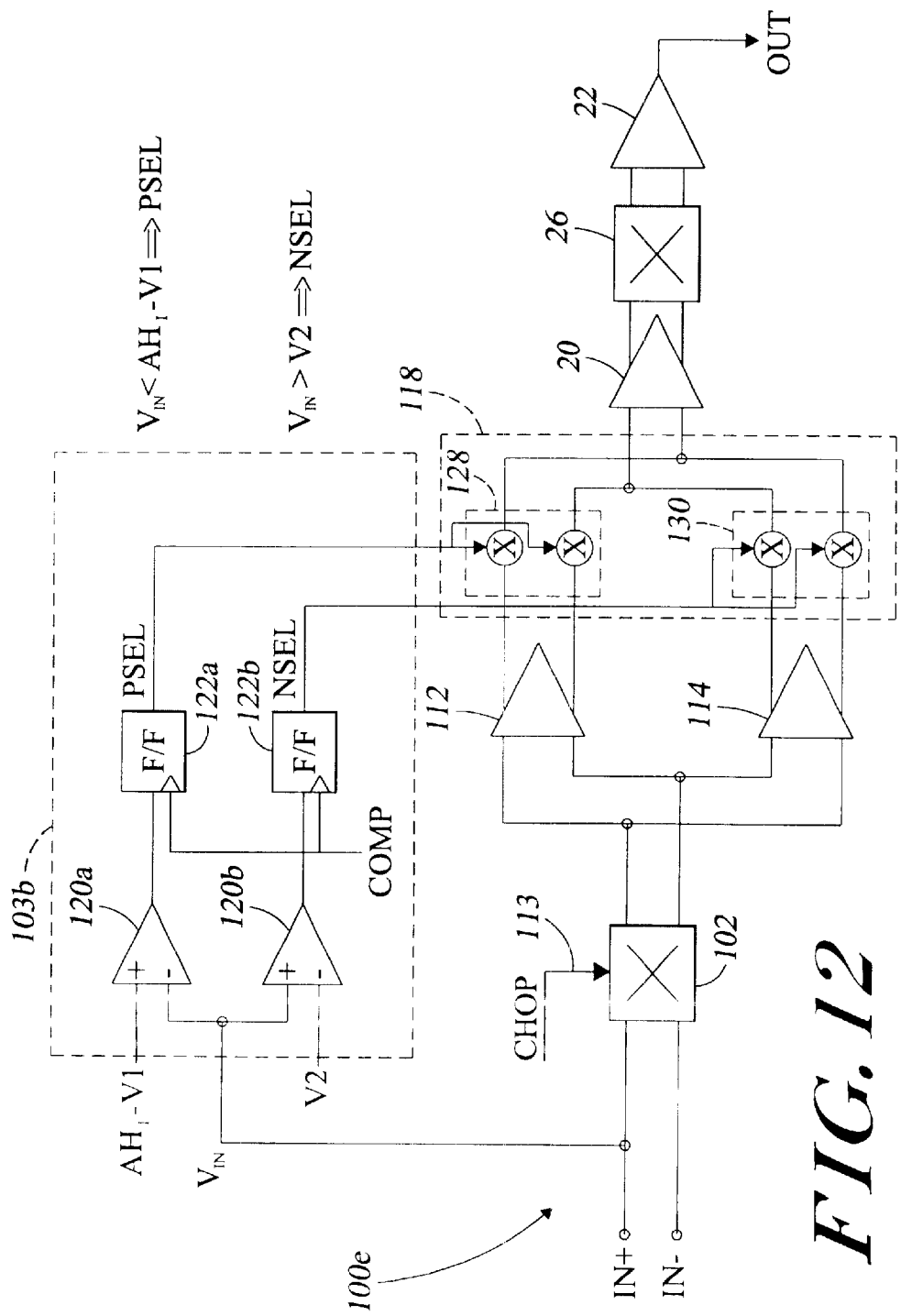
Figure 13:
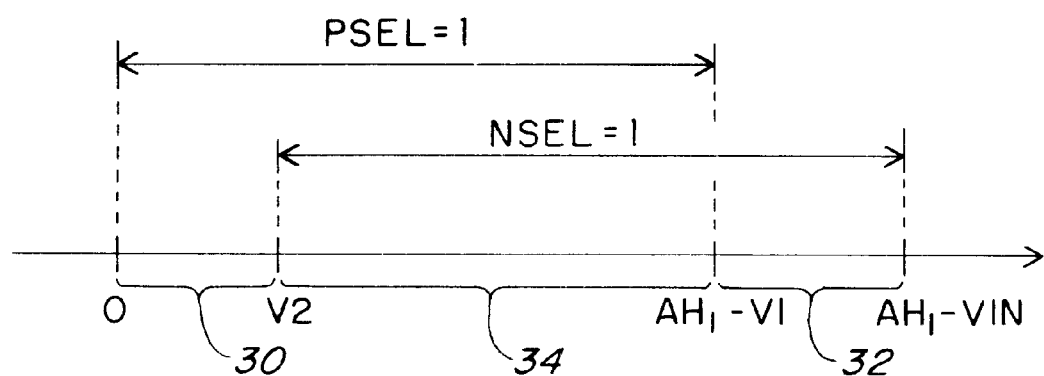
FIG. 13 is a graph useful in understanding the operation of the amplifier of FIG. 12.

In the embodiments described above in connection with FIGS. 3, 5, and 8–11, the comparator section 103 was arranged to enable only one of the two differential input stages to be coupled to the output (OUT) of the operational amplifiers 100 and 100*a*–100*d* during any period of time. That is, referring to FIG. 3, either stage 112 was coupled through switch section 128 or stage 114 was coupled through switch section 130 during any one period of time. Referring now to FIG. 12, an operational amplifier 100*e* is shown. Here, the comparator section 103*b* includes two comparators 120*a*, 120*b* each fed by the voltage VIN at terminal IN+ as the sense signal. Comparator 120*a* is also fed by the reference signal AHI–V1 while comparator 120*b* is fed by the reference signal V2. V1 is chosen to ensure full operation of input stage 112 when VIN<AHI–V1. V2 is chosen to ensure full operation of input stage 114 when VIN>V2. It is further arranged that AHI–V1>V2. The outputs of comparators 120*a*, 120*b* are fed as inputs to latches 122*a*, 122*b*, respectively, as shown. The output of latch 122*a* is fed to switch section 128 and the output of latch 122*b* is fed to switch section 130, as shown. When VIN<AHI–V1, logic signal PSEL is high (PSEL=1), switch section 128 is enabled and the output of stage 112 is coupled to stage 20 and thus to the output OUT of the amplifier 100*e*. When VIN>V2, logic signal NSEL is high (NSEL=1), switch section 130 is enabled and the output of stage 114 is coupled to stage 20 and thus to the output OUT of the amplifier 100*e*. Referring to FIG. 13, there is a region 30 where stage 112 is fully operational and coupled, there is a region 32 where stage 114 is fully operational and coupled, and there is a region 34 where both stages 112 and 114 are fully operational and coupled. However, there are no transition regions where one of the two stages 112, 114 is partially operational and coupled, as there was in FIG. 2.

Other embodiments are within the spirit and scope of the appended claims. For example, as noted above, each one of the two differential input stages may include a differential pair of bipolar transistors. In such case, one pair of the bipolar transistors in one of the stages would be PNP transistors and the other pair of the bipolar transistors in the other one of the stages would be NPN transistors (i.e., the PNP transistors being complementary in type to the PNP transistors).

What is claimed is:

1. An operational amplifier, comprising:
    two differential input stages, a first one of the stages comprising a pair of first input transistors and another one of such stages comprising a pair of second input transistors, such second input transistors being complementary in type to the first input transistors;

a comparator fed by a sense signal and a reference signal, such sense signal being related to at least one of a non-inverting and an inverting input signal fed to the operational amplifier, such comparator producing a control signal in accordance with a difference between the sense signal and the reference signal; and a switching network, responsive to the control signal, for inhibiting coupling of the first differential input stage to an output of the operational amplifier when the first differential input stage is partially operational and for inhibiting coupling of the second differential input stage to the output of the operational amplifier when the second differential input stage is partially operational.

2. The operational amplifier recited in claim 1 wherein only one of the differential input stages is coupled to the operational amplifier output at a given time.

3. The operational amplifier recited in claim 1 further including a latch fed by the control signal and a strobe signal, for latching the control signal in the latch in response to the strobe signal; and wherein the latched control signal is fed to the switching network.

4. The operational amplifier of claim I where the sense signal is the non-inverting input signal.

5. The operational amplifier recited in claim 1 where the first input transistors are of type PMOS and where the coupling of the first differential input stage to the operational amplifier output is inhibited when the sense signal is greater than the reference signal.

6. The operational amplifier recited in claim 1 where the second input transistors are of type NMOS and where the coupling of the second differential input stage to the operational amplifier output is inhibited when the sense signal is less than the reference signal.

7. An operational amplifier, comprising:

two differential input stages, a first one of the stages comprising a pair of first input transistors and another one of such stages comprising a pair of second input transistors, such second input transistors being complementary in type to the first input transistors;

a comparator fed by a sense signal and a reference signal, such sense signal being related to at least one of a non-inverting and an inverting input signal fed to the operational amplifier, such comparator producing a control signal in accordance with a difference between the sense signal and the reference signal; and a switching network, responsive to the control signal, for coupling either the first or the second differential input stage to an output of the operational amplifier selectively in accordance with the control signal.

8. The operational amplifier recited in claim 7 further including a latch fed by the control signal and a strobe signal, for latching the control signal in the latch in response to the strobe signal; and wherein the latched control signal is fed to the switching network.

9. The operational amplifier of claim 7 where the sense signal is the non-inverting input signal.

10. The operational amplifier recited in claim 7 where the first input transistors are of type PMOS and where the first differential input stage is coupled to the operational amplifier output when the sense signal is less than the reference signal.

11. The operational amplifier recited in claim 7 where the second input transistors are of type NMOS and where the second differential input stage is coupled to the operational amplifier output when the sense signal is greater than the reference signal.

12. An operational amplifier, comprising:

two differential input stages, a first one of the stages comprising a pair of first input transistors and another one of such stages comprising a pair of second input transistors, such second input transistors being complementary in type to the first input transistors;

a comparator fed by a sense signal and a reference signal, such sense signal being related to at least one of a non-inverting and an inverting input signal fed to the operational amplifier, such comparator producing a control signal in accordance with a difference between the sense signal and the reference signal;

a switching network, responsive to the control signal, for coupling either the first or the second differential input stage to an output of the operational amplifier selectively in accordance with the control signal; and an input chop circuit, adapted for coupling to a differential input signal that is formed by the non-inverting and inverting input signals, such chop circuit providing the differential input signal with a non-inverted polarity during a first time period and providing such differential input signal with an inverted polarity during a succeeding time period;

wherein the differential input signal with the provided inverted polarity and the provided non-inverted polarity are fed to the one of the two coupled stages during the first time period and the succeeding time period, respectively.

13. The operational amplifier recited in claim 12 further including a latch fed by the control signal and a strobe signal, for latching the control signal in the latch in response to the strobe signal; and wherein the latched control signal is fed to the switching network.

14. The operational amplifier of claim 12 where the sense signal is the non-inverting input signal.

15. The operational amplifier recited in claim 12 wherein the first input transistors are of type PMOS and wherein the first differential input stage is coupled to the operational amplifier when the sense signal is less than the reference signal.

16. The operational amplifier recited in claim 12 wherein the second input transistors are of type NMOS and wherein the second differential input stage is coupled to the operational amplifier when the sense signal is greater than the reference signal.

17. An operational amplifier, comprising:

two differential input stages, a first one of the stages comprising a pair of first input transistors and another one of such stages comprising a pair of second input transistors, such second input transistors being complementary in type to the first input transistors;

two comparators, a first one of the comparators being fed by a sense signal and a first reference signal and a second one of the comparators being fed by the sense signal and a second reference signal, such sense signal being related to at least one of a non-inverting and an inverting input signal fed to the operational amplifier, such comparators producing first and second control signals in accordance with differences between the sense signal and the first and second reference signals, respectively; and a switching network, responsive to the control signals, for coupling the first and second differential input stages to an output of the operational amplifier selectively in accordance with the control signals.

18. The operational amplifier recited in claim 17 further including:
- a first latch fed by the first control signal and a strobe signal, for latching the first control signal in the latch in response to the strobe signal;
- a second latch fed by the second control signal and the strobe signal, for latching the second control signal in the second latch in response to the strobe signal; and
- wherein the latched control signals are fed to the switching network.

19. The operational amplifier of claim 12 where the sense signal is the non-inverting input signal.

20. The operational amplifier recited in claim 17 wherein the first input transistors are of type PMOS and wherein the first differential input stage is coupled to the operational amplifier output when the sense signal is less than the first reference signal.

21. The operational amplifier recited in claim 17 wherein the second input transistors are of type NMOS and wherein the second differential input stage is coupled to the operational amplifier output when the sense signal is greater than the second reference signal.

* * * * *